(12) United States Patent
Zin et al.

(10) Patent No.: US 8,066,470 B2
(45) Date of Patent: Nov. 29, 2011

(54) WAFFLE PACK

(75) Inventors: Mohd Sabri Bin Mohamad Zin, Melaka (MY); Poh Chuan Fong, Melaka (MY); Woo Kuan Yee, Negeri Sembilan (MY); Peter Chin Ting Soon, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 1016 days.

(21) Appl. No.: 11/938,442

(22) Filed: Nov. 12, 2007

(65) Prior Publication Data

US 2009/0123257 A1    May 14, 2009

(51) Int. Cl.
*H01L 21/677* (2006.01)
(52) U.S. Cl. ............................................ 414/800
(58) Field of Classification Search ................... 414/800
See application file for complete search history.

(56) References Cited

U.S. PATENT DOCUMENTS 5,349,500 A * 9/1994 Casson et al. ............... 361/749
6,067,709 A * 5/2000 Godin et al. ................. 29/841

OTHER PUBLICATIONS

Shermer et al., "An Independent Journal Dedicated to the Advancement of Chip-Scale Electronics," Chip Scale Review, Aug.-Sep. 2001, downloaded Sep. 2, 2007 http://www.chipscalereview.com/issues/0801/techForum02_01.html.
DALSA Corporation "Geometric Search: Accurate Machine Vision in Challenging Conditions," Machine Vision Online, Apr. 27, 2005, downloaded Sep. 2, 2007 http://www.machinevisiononline.org/public/articles/articlesdetails.cfm?id=2449.
"Chip Carrier™ Chip Protection Solutions," Epak Electronics Ltd., downloaded Sep. 2, 2007, http://www.epakelectronics.com/aitjedecandwaffletrays.htm.

* cited by examiner

*Primary Examiner* — Saul Rodriguez
*Assistant Examiner* — Willie Berry, Jr.
(74) *Attorney, Agent, or Firm* — Beyer Law Group LLP

(57) ABSTRACT

An arrangement is described that includes a compartmentalized structure having a multiplicity of compartments defined by associated links and each having a bottom surface. The arrangement also includes a multiplicity of fiducials. The fiducials are positioned at top surfaces of the links that surround each compartment such that each compartment includes at least one associated fiducial at the top surface of an adjacent link that defines the compartment. The arrangement further includes an adhesive layer positioned on the bottom surface of each compartment. The at least one fiducial that surrounds each compartment is suitable for use by a vision system to identify the location of the associated compartment.

18 Claims, 4 Drawing Sheets

WAFFLE PACK

TECHNICAL FIELD

The present invention relates generally to the handling of electrical components. More particularly, an improved arrangement and method are described for precisely locating and picking up small electrical components.

BACKGROUND OF THE INVENTION

Electrical components including dice are presented to assembly systems in a variety of carrier forms including waffle pack, tape-and-reel and wafer ring formats. In general, specialized automated equipment must be used to pick up, align and position the electrical components onto suitable substrates.

For waffle pack handling, one relevant issue is the aspect ratio and size of the electrical components relative to the associated waffle pack compartments the components are positioned in. Conventional waffle packs are typically formed from plastic and produced using an injection molding system. Electrical components positioned within conventional waffle packs can be easily displaced during transportation and typical handling of the waffle pack. Even machine vibrations are sufficient to displace some miniscule components. In some cases, the electrical components may even be ejected from their associated compartments and/or damaged. Miniaturized components such as resistors, capacitors and inductors are especially prone to jostling and are easily displaced. The larger the compartments relative to the components they hold, the greater the opportunity for jostling, displacement and misalignment. Reducing the size of the compartments of the waffle pack allows for a reduction in the maximum displacement of the associated components positioned within the compartments during handling. However, conventional waffle packs are limited in available sizes, and in some instances, the compartments are even too large for certain very small components used in various modern applications. Furthermore, the use of custom-sized waffle packs is often cost-prohibitive.

Some automated assembly systems utilize vision systems and pattern recognition software. The pattern recognition software, or "machine vision," tools are used to guide a variety of robotic handling and assembly processes such as, by way of example, picking up electrical components from a waffle pack. In this case, the pattern recognition software is used to identify an electrical component within the waffle pack so that the system's pick-up tool can align itself to the electrical component and pick up the targeted electrical component. More specifically, in these applications, a robotic element moves to where the targeted electrical component is approximately located and captures an image of the waffle pack. The software is then used to find, identify and calculate the position of the targeted electrical component by recognizing patterns on the component. A pick-up tool then orientates (aligns) itself with the electrical component. The tool then picks up the electrical component and positions it on an appropriate substrate such as a printed circuit assembly or printed circuit board (PCB).

Although conventional arrangements and processes work well for many applications, there are continuing efforts to develop more efficient automated processes.

SUMMARY OF THE INVENTION

In one aspect, an arrangement is described that includes a compartmentalized structure having a multiplicity of compartments defined by associated links and each having a bottom surface. The arrangement also includes a multiplicity of fiducials. The fiducials are positioned at top surfaces of the links that surround each compartment such that each compartment includes at least one associated fiducial at the top surface of an adjacent link that defines the compartment. The arrangement further includes an adhesive layer positioned on the bottom surface of each compartment. The fiducials that surround each compartment are suitable for use by a vision system to identify the location of the associated compartment.

In various embodiments, a multiplicity of electrical components are each positioned in an associated compartment and adhesively secured to the associated adhesive layer on the bottom surface of the compartment. More specifically, each electrical component is positioned such that the position and orientation of the electrical component within its associated compartment is substantially the same as the other electrical components in their respective compartments.

In some embodiments, the compartmentalized structure is formed from a base and a stencil. The top surface of the base defines the bottom surfaces of the compartments, while the bottom surface of the base defines the bottom surface of the structure. The framework of the stencil defines the links of the compartmentalized structure. In some embodiments, the adhesive layers on the bottom surfaces of each compartment form a single integral adhesive layer that adhesively secures the top surface of the base with the bottom surface of the stencil.

In another aspect, a method is described for picking up components from an arrangement such as that just described. The method includes determining a location of a target compartment using a vision system that identifies at least one fiducial surrounding the compartment. The method also includes orientating a pick-up tool with the compartment and positioning the pick-up tool over the known position of the component using the fiducial and the determined location of the compartment as a reference. The method further includes picking up the component with the pick-up tool.

In another aspect, a method is described for forming pattern features for use in picking up components from a carrier. A stencil is provided that has a multiplicity of compartments defined by associated links. The method includes forming a multiplicity of fiducials on top surfaces of the links that surround each compartment. The fiducials are formed such that each compartment includes at least one associated fiducial at the top surface of a link defining the compartment. In various embodiments, the fiducials are formed by drilling, etching or scribing pattern features into the top surfaces of the links.

In some embodiments, the method further includes adhering the top surface of an adhesive layer to the bottom surface of the stencil. The method may also include adhering the bottom surface of the adhesive layer to a top surface of a base. The method may further include positioning a multiplicity of electrical components in the stencil such that each electrical component is positioned in an associated compartment and adhesively secured to the associated adhesive layer on the bottom surface of the compartment. The electrical components are positioned such that the position and orientation of each electrical component within its associated compartment is substantially the same as the other electrical components in their respective compartments.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF EXAMPLE EMBODIMENTS

The present invention relates generally to the handling of electrical components. More particularly, an improved arrangement and method are described for precisely locating and picking up small electrical components.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring of the present invention.

The following description focuses on waffle packs and similar carriers suitable for use in transporting and handling minuscule components, and particularly very small electrical components. By way of example, various electrical components may include integrated circuit (IC) dice, IC die packages, active components, passive components, and generally, any electrostatic sensitive device (ESD). Various embodiments of the present invention will be described with reference to FIGS. 1-4. Aspects of the present invention provide an arrangement and method for transporting and handling very small components that facilitates automated locating and picking up of the components.

Figure 1:
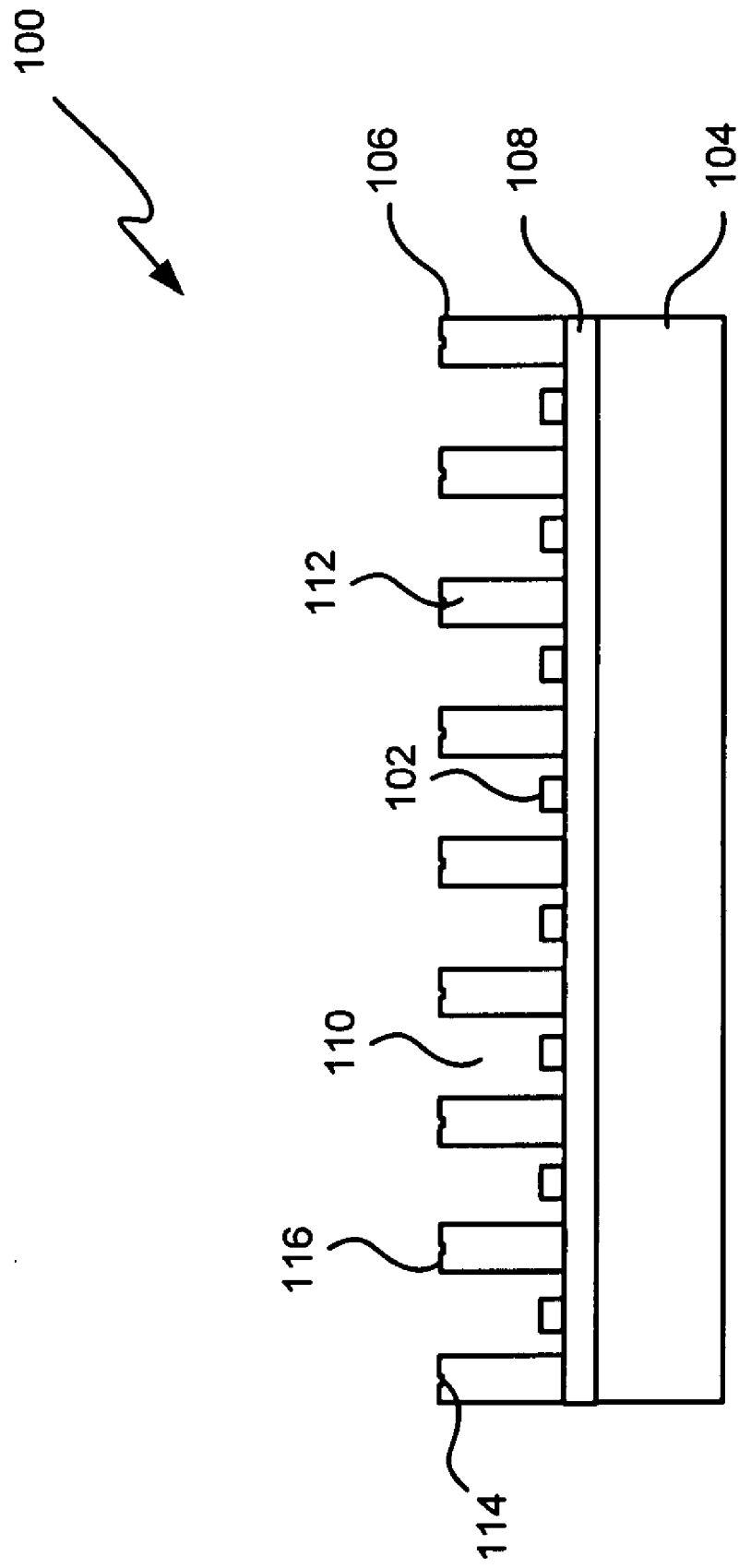
FIG. 1 illustrates a diagrammatic side view of a cross-section of a waffle pack in accordance with an embodiment of the present invention.
Figure 2:
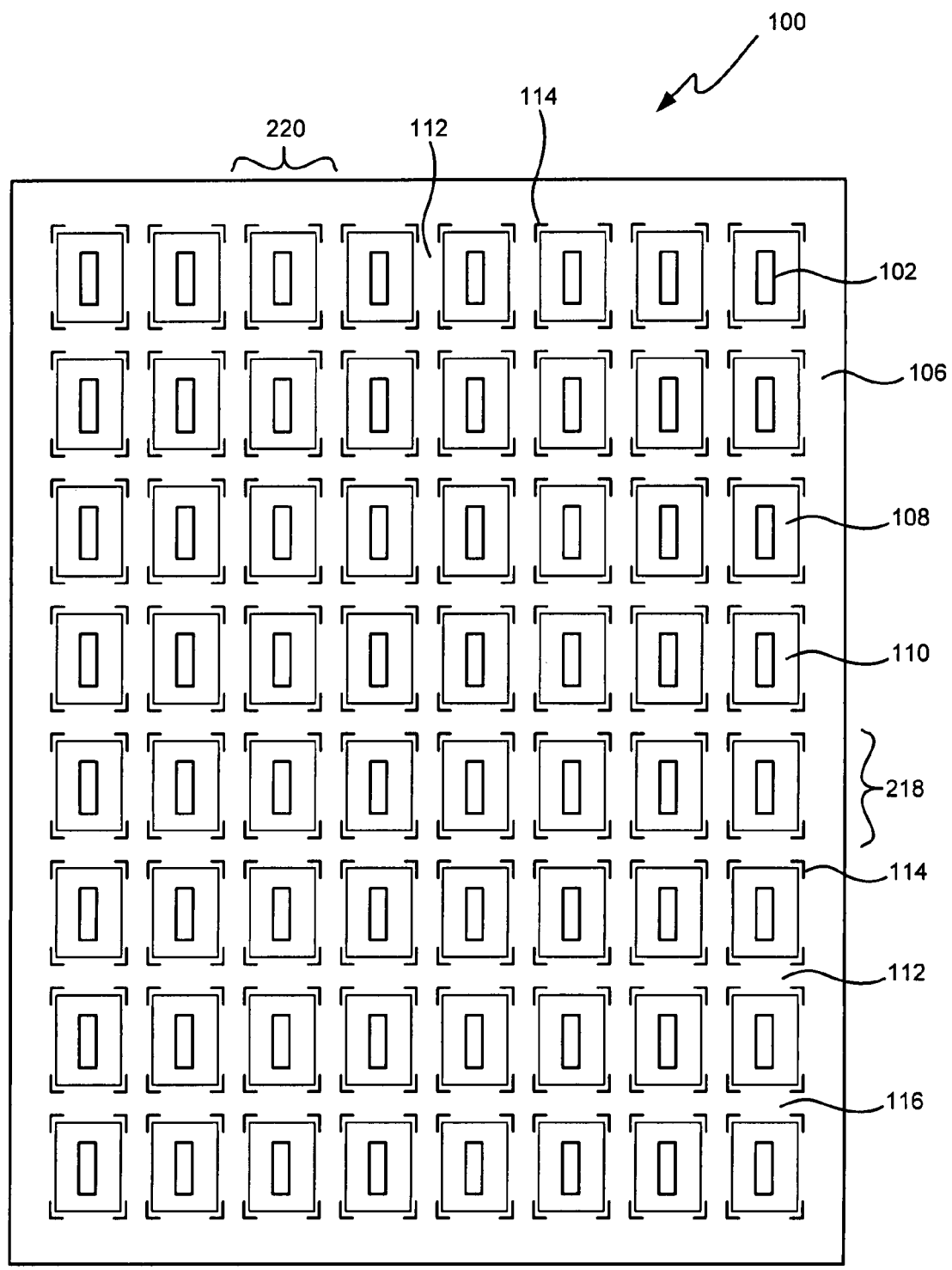
FIG. 2 illustrates a diagrammatic top view of a waffle pack in accordance with an embodiment of the present invention.

Referring initially to FIGS. 1 and 2, a waffle pack 100 is described that facilitates accurate and precise location and pick-up of electrical components 102 positioned within the waffle pack. In the illustrated embodiment, the waffle pack 100 includes a base 104 upon which a stencil 106 is positioned. In various embodiments, the base 104 and stencil 106 are adhesively secured with one another with an adhesive layer 108 positioned between the top surface of the base and the bottom surface of the stencil. In an alternate embodiment, the adhesive layer 108 may only be secured to the stencil 106. In some embodiments, the stencil 106 and base 104 have approximately the same footprint as shown by the cross-section illustrated in FIG. 1. In alternate embodiments, the footprint of the base 104 may be larger than the footprint of the stencil 106.

The framework of the stencil 106 defines a two-dimensional array of compartments 110 (also referred to herein as pockets or cavities) separated by the links (i.e., solid portions) 112 of the stencil. In the illustrated embodiment, each compartment 110 has substantially the same size. Although each compartment 110 is illustrated as substantially rectangular, any suitable geometry may also be used. The size and shape of the compartment 110 may vary but generally correspond to the size and shape of the component 102 to be positioned within the compartment. The number of rows 218 and columns 220 of compartments 110 may also vary widely. In the illustrated embodiment, there are 8 rows 218 and 8 columns 220 of compartments 110. However, it should be appreciated that in many implementations, far more rows and/or columns may be provided.

In various embodiments, the base 104 and stencil 106 are formed from either an electrically dissipative or electrically conductive material to reduce the likelihood of damage to the electrical components 102 caused by electrostatic discharge. By way of example, the base 104 and stencil 106 may be formed from a suitable metallic material such as aluminum or an aluminum alloy, among others. The base 104 and stencil 106 may also be formed using any suitable method. By way of example, the base 104 and stencil 106 may be cast or machined. In various embodiments, the compartments 110 within the stencil 106 may be formed by drilling out or otherwise removing portions of the stencil. Pattern recognition features, or fiducials, 114 are made in the top surfaces 116 of the links 112. There are many suitable processes for making the fiducials 114. By way of example, the fiducials may be made by etching, drilling or scribing (such as with, for example, a laser or other cutting tool) the top surfaces 116. The fiducials 114 are formed such that each compartment 110 has at least one associated fiducial on the top surface 116 of an associated adjacent link 112 that defines the compartment. In various embodiments, each compartment 110 has a plurality of associated fiducials 114. By way of example, in the embodiment illustrated in FIG. 2, each compartment 110 includes four associated fiducials 114. Additionally, the fiducials 114 may assume any suitable shape that is recognizable by various computer visions systems. In the illustrated embodiment, each fiducial has an "L-shape" and is positioned on the top surface 116 of a link 112 in proximity to each corner of an associated compartment 110.

The adhesive layer 108 may also be formed from any suitable material. By way of example, the adhesive layer 108 may be a single-sided adhesive tape, a double-sided adhesive tape or a tacky gel. The adhesive layer 108 is also used to secure each component 102 positioned within an associated compartment 110 in a fixed position within the compartment. In this way, displacement, rotation or other movement of the components 102 within the compartments 110 of the waffle pack 100 during handling is prevented. Additionally, the use of the adhesive layer 108 enables larger compartments 110 to be used thereby enabling the production of a more universal waffle pack 100 capable of carrying a wider variety of components having a wide variety of shapes and sizes. This is opposed to more customized waffle packs having compartments closely sized and shaped for specific components and which rely on walls of the compartments to roughly keep the components in position and which do little to prevent the components from "hopping" out of the compartments and/or hitting a cover positioned over the waffle pack.

The components 102 may be positioned within their associated compartments 110 either manually or with an automated positioning system. Every component 102 is positioned in precisely the same orientation at precisely the same location within its associated compartment 110 as the rest of the components 102 are positioned within their respective compartments. In this way, once a vision system has identified the exact location of the compartment 110 and orientated its pick-up tool relative to the compartment, the pick-up tool determines the precise position of the component 102 within the compartment and is able to pick up the component safely and reliably; that is, at a suitable location on the component without damaging the component.

In one example application, each compartment 110 is contemplated to hold an associated passive electrical component 102. By way of example, various passive electrical components include capacitors, inductors, and resistors, among others. Some modern passive components are miniscule in size. By way of example, some currently available capacitors have total lengths less than 0.60 mm and widths less than 0.30 mm, while others are still smaller. Passive components (and other components) this small generally don't have a readily recognizable pattern for conventional vision systems to detect. Suitable lengths, widths and depths of the compartments 102 used to hold these very small components may vary widely. By way of example, some compartments 110 designed to hold components 102 having lengths and widths less than (or even much less than) 1 mm may have lengths, widths and thicknesses in the range of approximately 0.5 to 1.6 mm, 0.2 to 0.8 mm and 0.7 to 1.1 mm, respectively.

In other applications it is contemplated to position IC dice or IC die packages such as flip-chip (FC) dice or FC die packages into the compartments 110 of the waffle pack 100. In these embodiments, the compartments 110 are may be larger but may also vary widely in size.

The aforementioned structure permits a wide variety of stencils having different compartment sizes and arrangements to be used in conjunction with a single base. In this way, the proposed waffle pack is more applicable in handling a wider variety of components. Additionally, bases and stencils made of metal are especially conducive to reuse or recycling. In various embodiments, the adhesive layer 108 may also be reused multiple times in securing components 102 and/or the base 104 and various stencils 106 with one another as long as the adhesive layer possesses sufficient adhesion.

The described waffle pack 100 enables automated machines to safely and reliably pick-up very small components 102 using the fiducials 114 as references to quickly and precisely locate targeted compartments 110 that hold components in fixed and known positions within their associated compartments. Automated machines may not otherwise be able to pick-up these components because they are unable to recognize and locate the components with current vision systems and pattern recognition programming. As such, the described waffle packs are applicable for handling smaller components than conventional waffle packs and additionally may provide increased throughput as a result of the reduced time needed to accurately and precisely identify the locations of the compartments and safely and reliably pick up the associated components within the compartments.

It will be appreciated by those skilled in the art that although specific waffle pack arrangements, geometries and materials have been described and illustrated, the invention is not limited to these described and illustrated embodiments.

Figure 3:
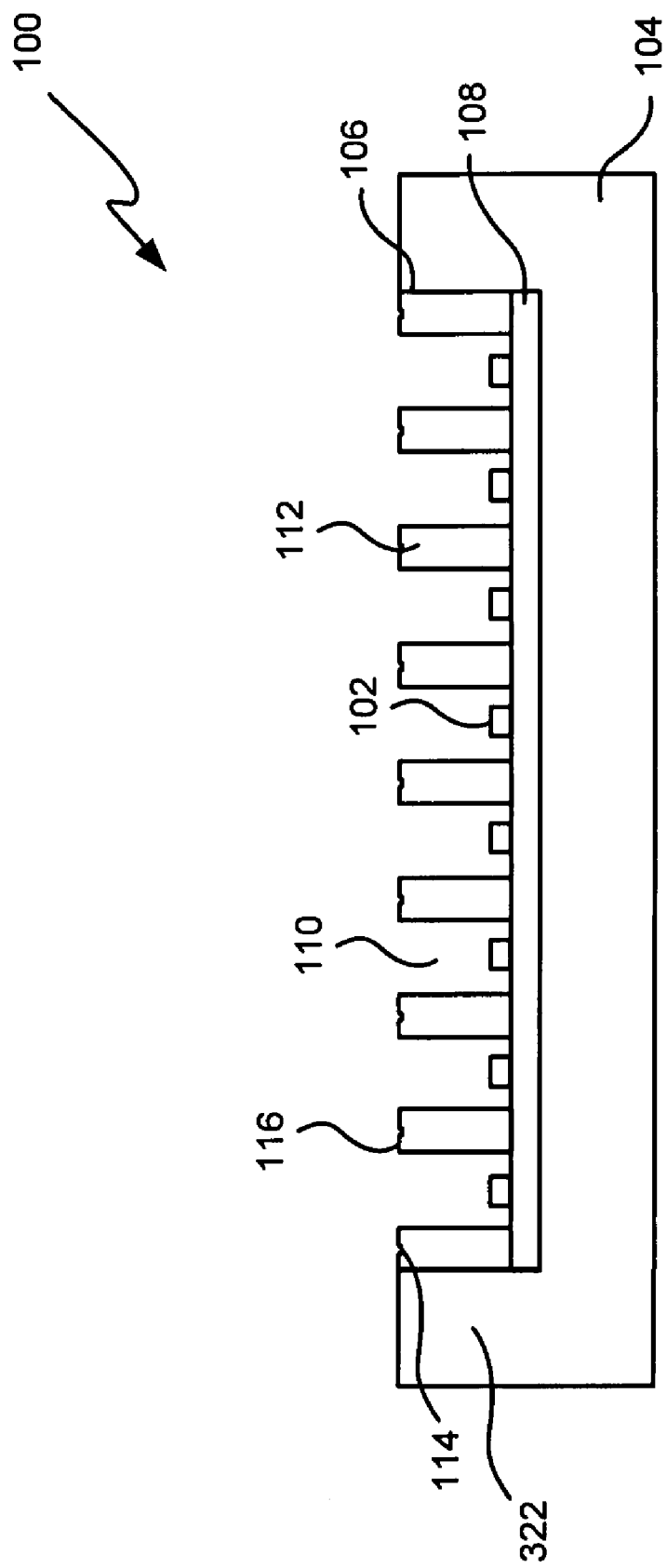
FIG. 3 illustrates a diagrammatic side view of a cross-section of a waffle pack in accordance with an embodiment of the present invention.

By way of example, as illustrated in FIG. 3, the base 104 may include raised walls 322. The walls 322 may be integrally formed with the base 104 and positioned at locations around the periphery of the base. The raised walls 322 define a region on the top surface of the base that may have approximately the same footprint as that of various associated stencils 106. In this way, various stencils 106 may be positioned within the region defined by the walls.

In some embodiments, the waffle pack 100 may also include a clamp or other locking mechanism used to secure the stencil 106 to the base 104. Additionally, the base 104 may include a vacuum inlet so that a partial vacuum may be drawn to secure the adhesive layer 108 to the base.

In various embodiments, the waffle pack 100 may also include a cap, lid or cover that is positioned on top of the stencil 106. Although the adhesive layer 108 prevents the electrical components 102 from moving within their associated compartments 110, the cover may be useful in keeping dust and various other particulates from entering the waffle pack 100 and contacting the components.

Additionally, in other example embodiments, the base 104 and stencil 106 may be formed from other suitable materials including, by way of example, various plastics. In principle, pattern recognition features or fiducials can be created on a variety of suitable materials, including conventional plastic materials. In another example embodiment, the base 104 and stencil 106 may be integrally formed with one another to produce the waffle pack 100. By way of example, an injection molding system may be used to form a plastic waffle pack 100 or a mold casting system may be used to form a cast metal waffle pack. In these embodiments, the mold may be designed such that the mold itself produces the fiducials 114 upon injection of suitable materials into the mold. Alternatively, fiducials 114 may be drilled or otherwise cut into the waffle pack 100. By way of example, a laser may be used to scribe the fiducials 114 into the waffle pack material. In these embodiments, an adhesive layer may be deposited on the bottom surface of each compartment with any suitable means including, by way of example, liquid adhesive dispensers.

In still another example embodiment, a sufficiently strong adhesive layer 108 may itself serve as the base 104. Additionally, the adhesive layer may be a UV releasable adhesive layer that loses its adhesion upon exposure to UV radiation to release the components 102 and/or the stencil 106 from the base 104.

Figure 4:
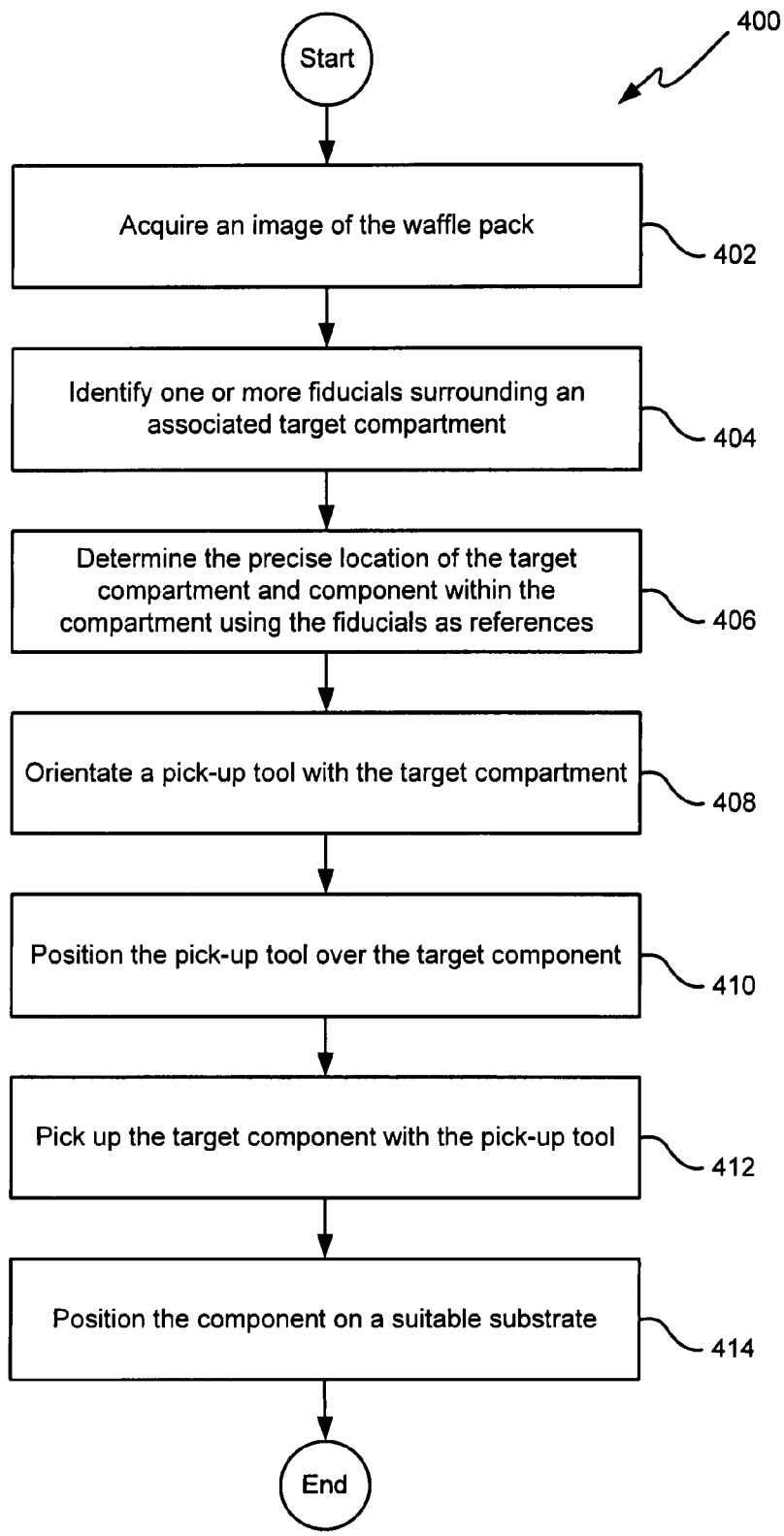
FIG. 4 is a flow chart illustrating a process of picking up components from a waffle pack in accordance with an embodiment of the present invention.

FIG. 4 illustrates a process 400 for picking up components from a waffle pack arrangement such as the waffle pack 100 described with reference to FIGS. 1-3. At 402 a vision system is used to acquire an image of the waffle pack. In particular, the vision system acquires an image of the approximately known location of a target compartment of the waffle pack. At 404, the vision system identifies one or more fiducials that surround the associated target compartment. By way of example, pattern recognition software may utilize grayscale correlation, edge detection, or a number of other suitable techniques to find the fiducials in the image being inspected. The vision system and/or associated pattern recognition software then determines the precise location of the target compartment and target component within the compartment at 406 using the fiducials surrounding the compartment as references. At 408, a pick-up tool orientates itself with the compartment. This may be accomplished either by re-orientating the pick-up tool or, conversely, by re-orientating the waffle pack. At 410, the pick-up tool is then positioned over the known position of the target component within the waffle pack (In some embodiments there may be more than one component in each compartment of the waffle pack). The pick-up tool then picks up the target component at 412. The component may then be positioned at 414 onto a suitable substrate such as a printed circuit board (PCB) or leadframe, among various others.

By way of example, in one example application, solder bumped flip-chip (FC) dice may be presented to a flip-chip die attach machine in associated compartments of a waffle pack. The FC die attach machine may be configured to recognize fiducials surrounding the compartments of the waffle pack. Using the fiducials as references, a pick-up tool can identify the precise location of a FC die and subsequently pick up the die from the waffle pack at a precise location(s) on the die. In some cases, the FC die may then be inverted. The solder bumps on the active surface of the FC die may then be more accurately aligned with and positioned on contacts on a suitable substrate such as a PCB or leadframe.

In contrast, conventional methods rely on fiducials or patterns on the components themselves for identification and location of the components. By way of example, bond pads on the active surface of a die are often used by vision systems for recognition; however, if the die has been previously probed, the residual probe marks may confound recognition and location of the die. Other die circuit elements are also conventionally used as fiducials. However, die circuit elements suffer from inconsistencies including mask revisions or passivation changes that may also pose problems in vision recognition.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An arrangement, comprising:
 a compartmentalized structure having a multiplicity of compartments defined by associated links and each having a bottom surface;
 a multiplicity of fiducials, the fiducials being positioned at top surfaces of the links that surround each compartment such that each compartment includes at least one associated fiducial at the top surface of an adjacent link defining the compartment;
 an adhesive layer positioned on the bottom surface of each compartment; and
 a multiplicity of electrical components, each electrical component being positioned in an associated compartment and adhesively secured to the associated adhesive layer on the bottom surface of the compartment such that the position and orientation of each electrical component within its associated compartment is substantially the same as the other electrical components in their respective compartments.

2. An arrangement as recited in claim 1, wherein the compartmentalized structure further comprises
 a base, a top surface of the base defining the bottom surfaces of the compartments, a bottom surface of the base defining a bottom surface of the structure; and
 a stencil, a framework of the stencil defining the links of the compartmentalized structure, a top surface of the stencil defining top surfaces of the links.

3. An arrangement as recited in claim 2, wherein the adhesive layers on the bottom surfaces of each compartment form a single integral adhesive layer that also adhesively secures the bottom surface of the stencil to the base.

4. An arrangement as recited in claim 1, wherein the at least one fiducial that surrounds each compartment is suitable for use by a vision system to identify the location of the associated compartment.

5. An arrangement as recited in claim 1, wherein the compartments of the compartmentalized structure are arranged in a two-dimensional array.

6. An arrangement as recited in claim 1, wherein the compartments are substantially rectangular.

7. An arrangement as recited in claim 1, wherein the base is formed of a metallic material.

8. An arrangement as recited in claim 1, wherein the stencil is formed of a metallic material.

9. An arrangement as recited in claim 1, wherein each compartment includes four fiducials.

10. An arrangement as recited in claim 1, wherein each fiducial is positioned at a corner of its associated compartment.

11. An arrangement as recited in claim 2, wherein each compartment includes four fiducials that are positioned at corners of the compartment and the fiducials are suitable for use by a vision system to identify the location of the associated compartment.

12. An arrangement as recited in claim 2, wherein the compartments of the compartmentalized structure are substantially rectangular and are arranged in a two-dimensional array.

13. An arrangement as recited in claim 2, wherein the base and the stencil are both formed from metallic materials.

14. An arrangement comprising:
 a compartmentalized structure having a multiplicity of compartments defined by associated links and each having a bottom surface, wherein the compartmentalized structure includes
 (i) a base, a top surface of the base defining the bottom surfaces of the compartments, a bottom surface of the base defining a bottom surface of the structure, and
 (ii) a stencil, a framework of the stencil defining the links of the compartmentalized structure, a top surface of the stencil defining top surfaces of the links;
 a multiplicity of fiducials, the fiducials being positioned at top surfaces of the links that surround each compartment such that each compartment includes at least one associated fiducial at the top surface of an adjacent link defining the compartment; and
 an adhesive layer positioned on the bottom surface of each compartment; and
 wherein the base includes raised walls, the raised walls defining a region on the top surface of the base, a footprint of the region defined by the walls being substantially the same as a footprint of the stencil, wherein the stencil is positioned within the region defined by the walls.

15. A compartmentalized carrier for holding electrical components, the compartmentalized carrier having a multiplicity of compartments and comprising:
 a base wherein a top surface of the base defines bottom surfaces of the compartments;
 a stencil secured to the base, wherein the stencil has a multiplicity of links that define the compartments;
 an adhesive layer positioned on the bottom surface of each compartment; and
 a multiplicity of fiducials located on a top surface of the stencil such that each compartment includes at least one associated fiducial; and
 wherein the adhesive layer is suitable for temporarily holding electrical components in place in a set orientation such that the electrical components can be picked from the compartments when desired and the fiducials may be used to provide a reference for a device used to pick the electrical components from the compartments.

16. An arrangement as recited in claim 15, wherein the adhesive layer adhesively secures the top surface of the base with the bottom surface of the stencil.

17. An arrangement as recited in claim 15, further comprising a multiplicity of electrical components, each electrical component being positioned in an associated compartment and adhesively secured to the associated adhesive layer on the bottom surface of the compartment such that the position and orientation of each electrical component within its associated compartment is substantially the same as the other electrical components in their respective compartments.

18. An arrangement as recited in claim 15, wherein the adhesive is a releasable adhesive.

* * * * *